(12) United States Patent
Pan

(10) Patent No.: US 6,271,553 B1
(45) Date of Patent: Aug. 7, 2001

(54) PHOTO SENSOR IN A PHOTO DIODE

(75) Inventor: Jui-Hsiang Pan, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/450,021

(22) Filed: Nov. 29, 1999

(51) Int. Cl.[7] .................. H01L 31/062; H01L 31/113
(52) U.S. Cl. .................. 257/291; 257/292; 257/461; 257/463; 257/465; 438/59
(58) Field of Search .................. 257/292, 465, 257/463, 461, 291; 438/59

(56) References Cited

U.S. PATENT DOCUMENTS

| | | | |
|---|---|---|---|
| 6,040,592 | * 3/2000 | McDaniel et al. | 257/292 |
| 6,051,447 | * 4/2000 | Lee et al. | 438/48 |
| 6,084,259 | * 7/2000 | Kwon et al. | 257/292 |
| 6,090,639 | * 7/2000 | Pan | 438/59 |
| 6,100,551 | * 8/2000 | Lee et al. | 257/232 |
| 6,166,405 | * 12/2000 | Kuriyama et al. | 257/290 |

* cited by examiner

Primary Examiner—William Mintel
(74) Attorney, Agent, or Firm—Winston Hsu

(57) ABSTRACT

The surface of a semiconductor wafer comprises a silicon substrate and a well positioned in a predetermined area just under the surface of the substrate. A photo diode comprises a MOS transistor positioned on the surface of the well, a photo sensor positioned beside the well and electrically connected to the MOS transistor, and an insulation layer positioned on the surface of the substrate surrounding the photo sensor. The photo sensor comprises a first doped region positioned on the surface of the photo sensor, and a second doped region positioned between the first doped region and the insulation layer, a portion of the second doped region at least partially under the insulation layer. The dopant density of the second doped region is less than that of the first doped region, and the second doped region functions to reduce the electrical field around the first doped region so as to reduce the leakage current.

6 Claims, 5 Drawing Sheets

PHOTO SENSOR IN A PHOTO DIODE

BACKGROUND OF THE INVENTION

1. Field of the Invention

The present invention relates to a photo sensor in a photo diode on a semiconductor wafer and a method of forming the photo sensor.

2. Description of the Prior Art

The photo diode is a semiconductor device comprising a photo-conductivity cell and a junction diode, and is commonly used in photoelectric products, such as cameras and the photo sensors of scanners. The light-induced current of the photo diode represents a signal, whereas the current present in the absence of light represents noise. The photo diode processes signal data by using the magnitude of the signal-to-noise ratio. In the semiconductor industry, it is often desired to increase the light-induced current of the photo diode so as to increase the signal-to-noise ratio, and hence to enhance the contrast of the signal. The sensitivity of the photo diode would be enhanced and the quality of the photo diode would be improved.

Please refer to FIG. 1. FIG. 1 is a cross-sectional diagram of the structure of a prior art photo diode 10. A prior art photo sensor 20 in the photo diode 10 is positioned on a semiconductor wafer 11. The semiconductor wafer 11 comprises a silicon substrate 12 and a p-well 14 positioned on the silicon substrate 12. The photo diode 10 comprises an n-type metal oxide semiconductor (NMOS) transistor 16 positioned on the surface of the p-well 14, and a photo sensor 20 formed on the surface of the p-well 14 and electrically connected to the NMOS transistor. The semiconductor wafer 11 also comprises a field oxide layer 18 positioned on the surface of the p-well 14 that surrounds the photo sensor 20. The field oxide layer 18 acts as a dielectric insulating material to prevent short circuiting between the photo sensor and other units.

In the formation of the prior art photo sensor 20 of the photo diode 10, a high dosage of arsenic (As) atoms is used as the major dopant in an ion implantation process. This ion implantation process is performed to form an n-type doped region 22 on the surface of the p-well 14. A depletion region 24 for detecting the leakage current is formed along the PN junction between the doped region 22 and the adjacent p-type well 14. In FIG. 1, the area marked with slanting lines illustrates the depletion region 24.

The doped region 22 formed by the high dosage ion implantation process, and the p-well 14 that also has a high doping density, will both result in a narrower width of the depletion region 24, and will also decrease the real active region of the photo sensor 20. Therefore, the light-induced current sensed by the depletion region 24 is reduced. In addition, the interface of the doped region 22 and the p-well 14 under the field oxide layer 18 induces additional noise. As a result, the signal-to-noise ratio is lowered and the sensitivity of the photo sensor 20 is reduced.

SUMMARY OF THE INVENTION

It is therefore a primary objective of the present invention to provide a photo sensor in a photo diode to solve the above mentioned problems.

In a preferred embodiment, the present invention provides a photo sensor in a photo diode on a semiconductor wafer. The surface of the semiconductor wafer comprises a silicon substrate and a p-well. The photo diode comprises an NMOS transistor positioned on the surface of the p-well serving as a reset MOS transistor of the photo diode, a photo sensor positioned beside the p-well and electrically connected to the NMOS transistor, a field oxide layer surrounding the photo sensor and acting as an insulation layer, and a channel stop positioned under the field oxide layer. The photo sensor comprises a first n-type doped region positioned on the surface of the photo sensor and doped with arsenic (As) atoms, and a second n-type region positioned between the first n-type region and the insulation layer. The second n-type doped region is doped with phosphorus (P) atoms. The doping density of the second n-type doped region is lower than that of the first n-type doped region. The depth of the second n-type doped region is deeper than the bottom of both the field oxide layer and the first n-type doped region, and the second n-type doped region is at least partially under the field oxide layer. The second n-type doped region functions to reduce the electrical field around the first n-type doped region so as to reduce the leakage current. In addition, dopants in the second n-type doped region will interact with the substrate to form a depletion layer so as to enhance the sensitivity of the photo diode.

In the formation of the preferred embodiment, the present invention method is based on the above mentioned semiconductor wafer. A first ion implantation process is performed to form the first n-type doped region on the surface of the photo sensor, using arsenic atoms as dopants. The dosage and the energy for the first ion implantation process are around $10^{16}$ cm$^{-3}$ and less than 80 Kev, respectively. Then a second ion implantation process is performed between the first n-type doped region and the insulation layer on the surface of the photo sensor area to form the second n-type doped region, using phosphorus atoms as dopants. The dosage and the energy in the second ion implantation process are less than $10^{13}$ cm$^{-3}$ and larger than 200 Kev, respectively.

It is an advantage of the present invention that a lower dosing density second n-type doped region surrounds the photo sensor to reduce the electrical field of the PN junction and thereby reduce the leakage current. In addition, the depletion region is formed at a shallower depth, so the sensitivity of the depletion region to blue light is better.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
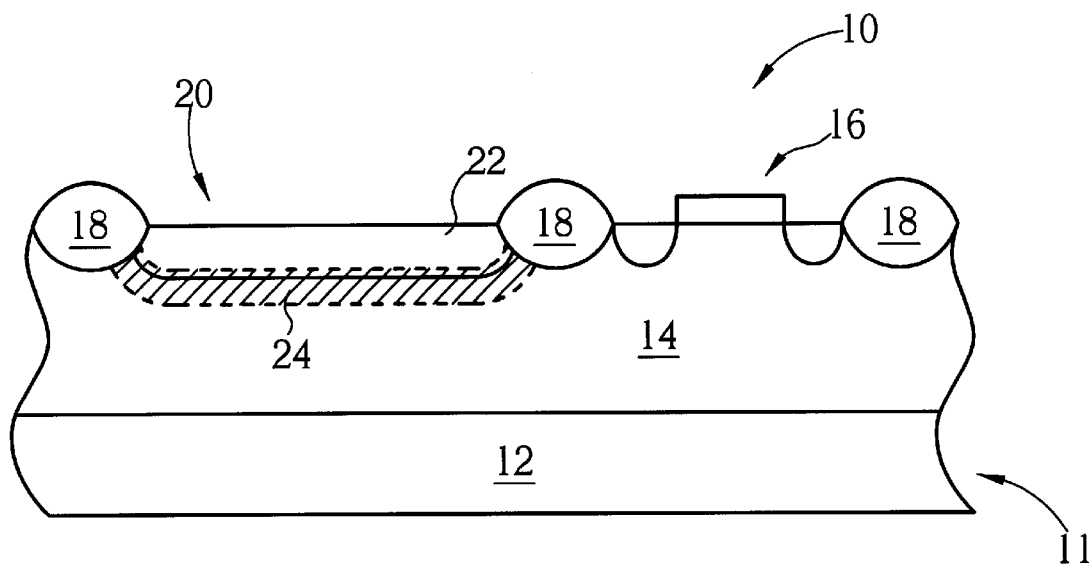
FIG. 1 is a cross-sectional diagram of the structure of the prior art photo diode.
Figure 2:
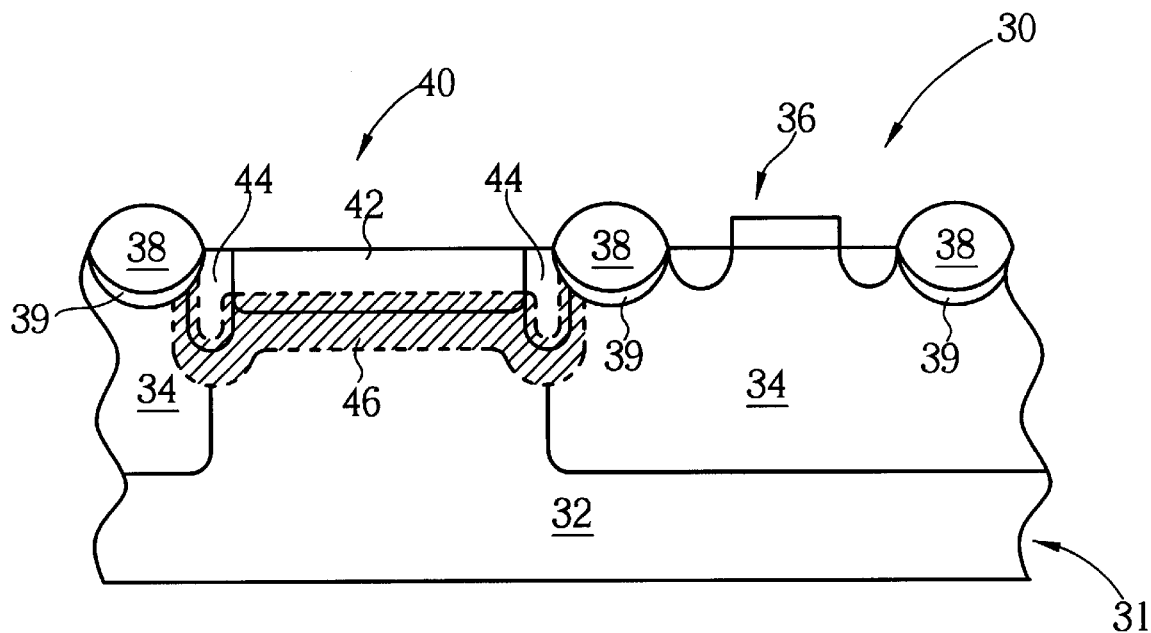
FIG. 2 is a cross-sectional diagram of the structure of the present invention photo diode.

Please refer to FIG. 2. FIG. 2 is a cross-sectional diagram of the structure of a present invention photo diode 30. The present invention provides the method for forming a photo sensor 40 in the photo diode 30. In the following description, a semiconductor wafer which comprises a silicon p-type silicon substrate is considered. A semiconductor wafer 31 comprises a p-type silicon substrate 32, and a p-well 34 positioned on a predetermined area of the p-type silicon substrate 32. The photo diode 30 comprises an NMOS transistor 36 positioned on the surface of the p-well 34, a photo sensor 40 positioned beside the p-well 34 and electrically connected to the NMOS transistor 36, a field oxide layer 38 positioned on the surface of the silicon substrate 32 and surrounding the photo sensor 40, and a channel stop 39 positioned under the field oxide layer 38. The NMOS transistor 36 functions as the reset MOS transistor of the photo diode to zero the photo sensor 40. The field oxide layer 38 acts as dielectric insulating material to prevent short-circuiting between the photo sensor 40 and other units. The channel stop 39 is used to prevent inversion of the field oxide layer 38 that could result in short-circuiting.

The present invention photo sensor 40 comprises an n-type doped region 42 positioned on the photo sensor 40, and an n-type doped region 44 positioned between the n-type doped region 42 and the field oxide layer 38. The depth of the n-type doped region 44 is greater than the depth of both the field oxide layer 38 and the n-type doped region 42, and a portion of the n-type doped region 44 is at least partially under the field oxide layer 38. The dopants of the n-type doped regions 42 and 44 are arsenic atoms and phosphorus atoms, respectively.

The doping density of the n-type doped region 44 is lower than that of the n-type doped region 42. The n-type doped region 44 reduces the electrical field under the field oxide layer 38 around the n-type doped region 42 to reduce the noise associated with this field. In addition, a depletion region 46 for detecting leakage current is formed along the PN junction between the n-type doped region 44 and the adjacent silicon substrate 32. In FIG. 2, the area marked with slanting lines illustrates the depletion region 46.

The above mentioned example is given with a p-type silicon substrate 32. If the silicon substrate is n-type, then the well positioned on it would be an n-well and the two doped regions of the photo sensor would be p-type. In this case, the dopants in the doped region 42 and 44 would be $BF_2^+$ and boron (B), respectively.

Figure 3:
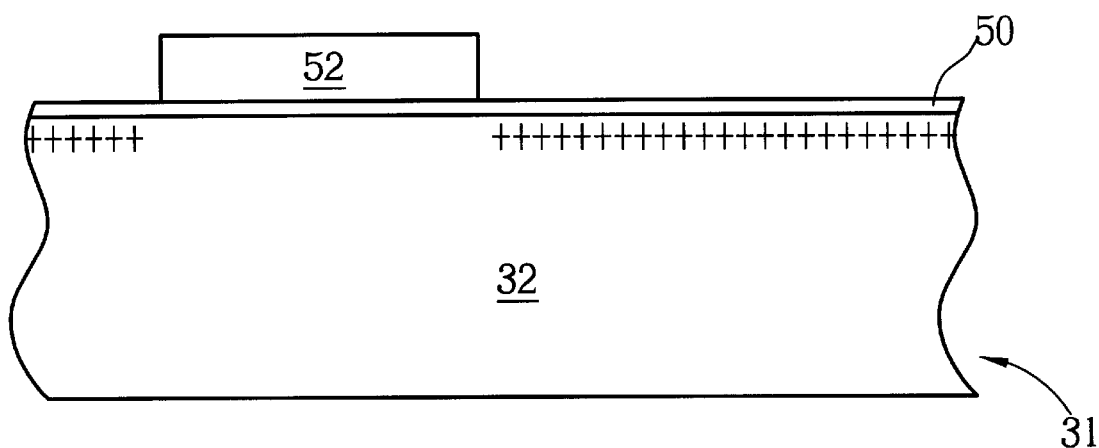
FIG. 3 to FIG. 7 are cross-sectional diagrams of the formation process of the photo sensor in the photo diode according to the present invention.

Please refer to FIG. 3 to FIG. 7. FIG. 3 to FIG. 7 are cross-sectional diagrams of the process of forming the photo sensor 40 in the photo diode 30 according to the present invention. The following description considers the case of a semiconductor wafer which comprises a p-type silicon substrate. As shown in FIG. 3, in the present invention the semiconductor 31 with a p-type silicon substrate 32 is placed into a thermal oxidation furnace after a cleaning process has been performed. A thermal oxidation process is performed to form a silicon oxide layer 50 that can be hundreds of angstroms thick on the surface of the silicon substrate. The silicon oxide layer 50 acts as a sacrificial oxide layer in a following ion implantation process; it enhances the scattering of ions to prevent channeling. A photoresist is coated over the surface of the silicon substrate 32, and the predetermined photo sensor 40 area is defined to remove the photoresist layer in the other regions, leaving only the partial photoresist layer 52. An ion implantation process using boron (B) as the dopant is then performed on the areas not covered by the photoresist layer 52. The energy during the ion implantation process is around 180 KeV.

Figure 4:
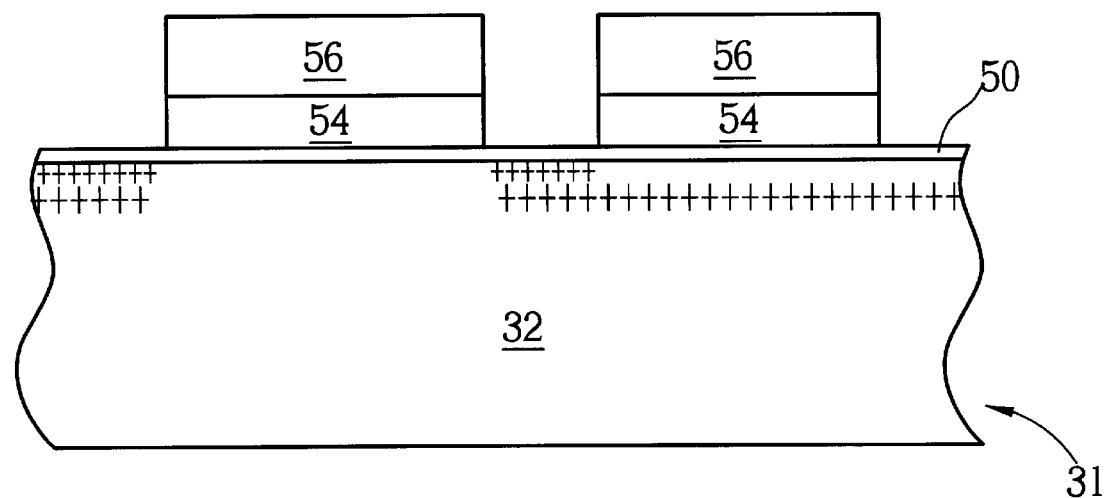

The photoresist layer 52 is stripped. A thin film deposition process is performed using a chemical vapor deposition method. A silicon nitride layer 54, around 1000 to 2000 angstroms thick, is thus formed on the silicon oxide layer 50. A photoresist layer 56 is coated on the surface of the silicon nitride layer 54. A lithographic process is used to remove a portion of the photoresist layer 56 from a predetermined region. A dry etching process is then performed to remove the silicon nitride layer 54 that isn't covered by the photoresist layer 56. The residual silicon nitride layer 54 on the wafer 31 is used as the mask of a local oxidation (LOCOS) process to define the active area, as shown in FIG. 4. An ion implantation process is performed for the formation of the later channel stop 39 by implanting group IIIA ions, such as boron (B) ions.

Figure 5:
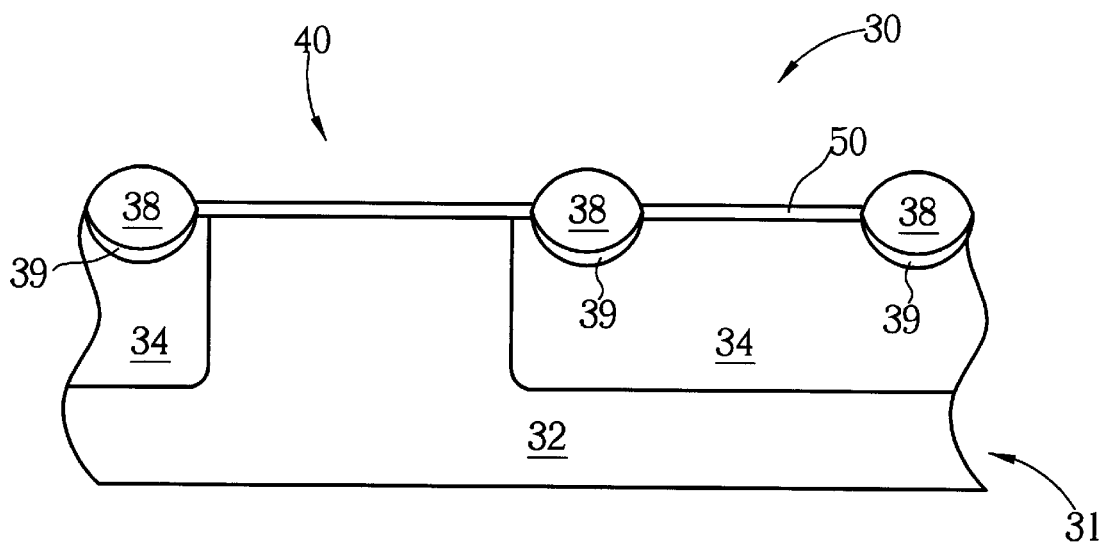

After stripping the photoresist layer 56, the formation of p-well 34, field oxide layer 38 and channel stop 39, as shown in FIG. 5, is performed. The semiconductor wafer 31 is placed into a thermal oxidation furnace after a cleaning process. The field oxide layer 38 is grown using a wet oxidation process and simultaneously the boron ions are driven into the silicon substrate 32 to form the channel stop 39 under the field oxide layer 38. This step takes advantage of silicon nitride, which prevents diffusion of oxygen and water, to form the field oxide layer 38. A wet etching process follows to strip the silicon nitride layer 54. Heated phosphoric acid is used as the etching solution.

Figure 6:
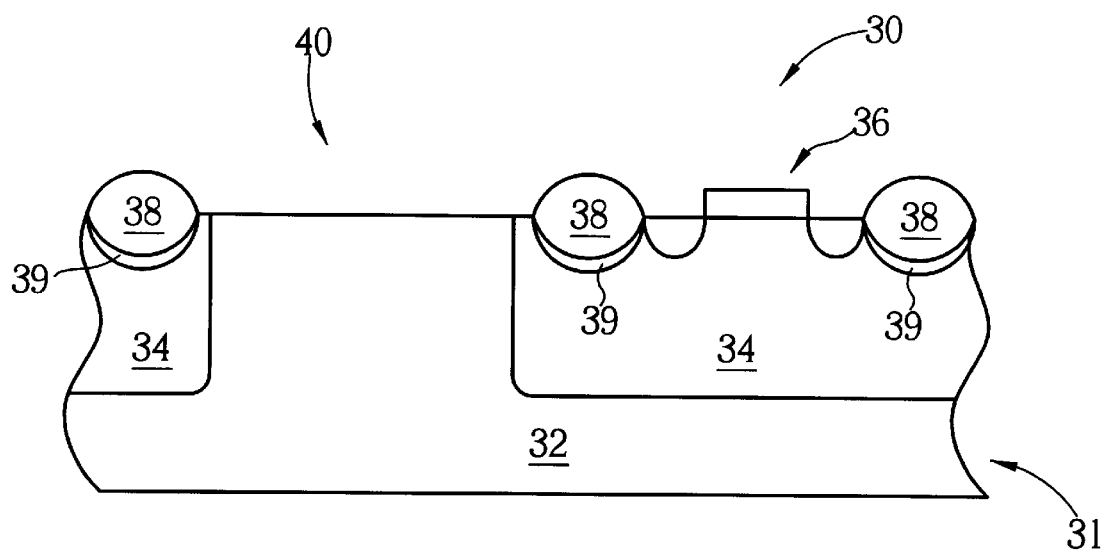
Figure 7:
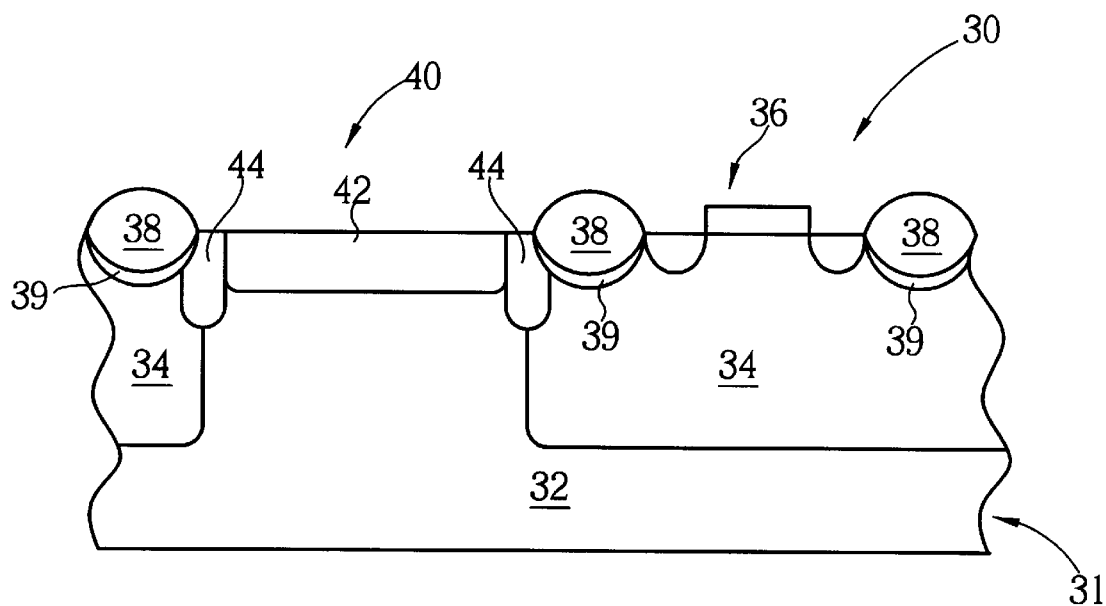

The silicon oxide layer 50 is stripped completely. Ion implantation processes, thin film deposition processes and cleaning processes are performed on the surface of wafer 31 to form an NMOS transistor 36, as shown in FIG. 6. As shown in FIG. 7, an ion implantation process is performed to form an n-type doped region 42 on the surface of the photo sensor 40, using arsenic (As) atoms as the doping ions. The dosage and the energy in the ion implantation process are around $10^{16}$ cm$^{-3}$ and less than 80 KeV, respectively. Another ion implantation process is then performed to form the n-type doped region 44 between the n-type doped region 42 and the field oxide layer 38, using phosphorus (P) atoms as the doping ions. The dosage and the energy in the ion implantation process are less than $10^3$ cm$^{-3}$ and higher than 200 KeV, respectively.

Although in the above description the NMOS transistor 36 is formed before the photo sensor 40, the processing order of the two devices could be swapped, or they could be formed together simultaneously. In addition, the order of the ion implantation processes for the n-type doped regions 42 and 44 could also be exchanged.

Figure 8:
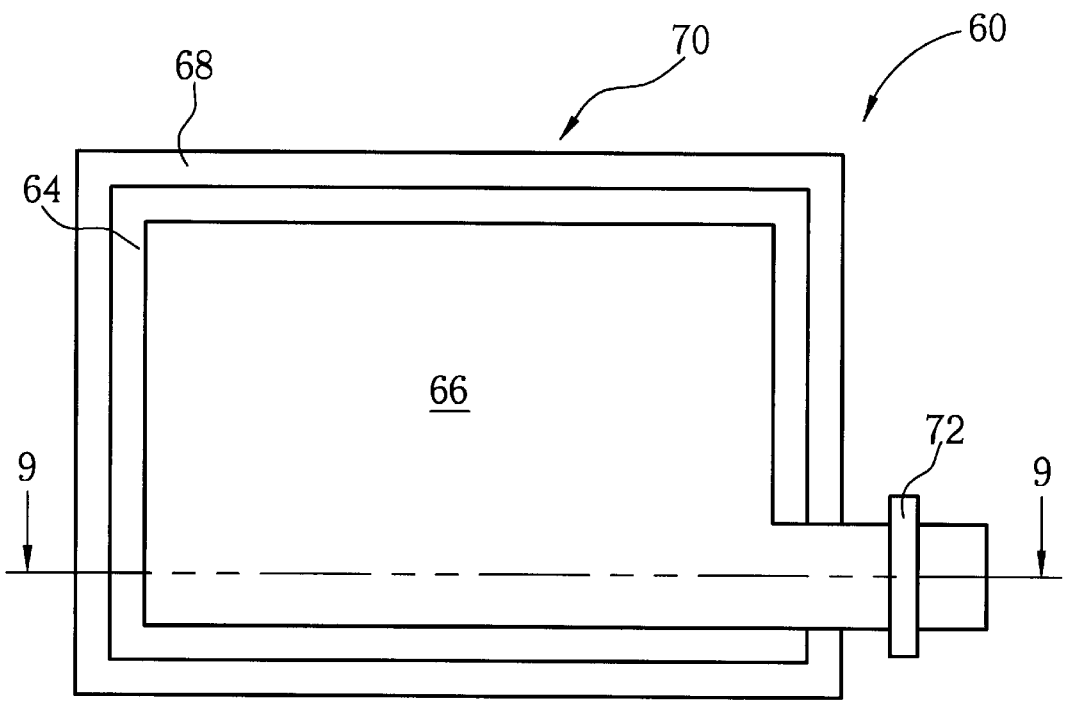
FIG. 8 is an overhead view of an alternative photo diode of the present invention.
Figure 9:
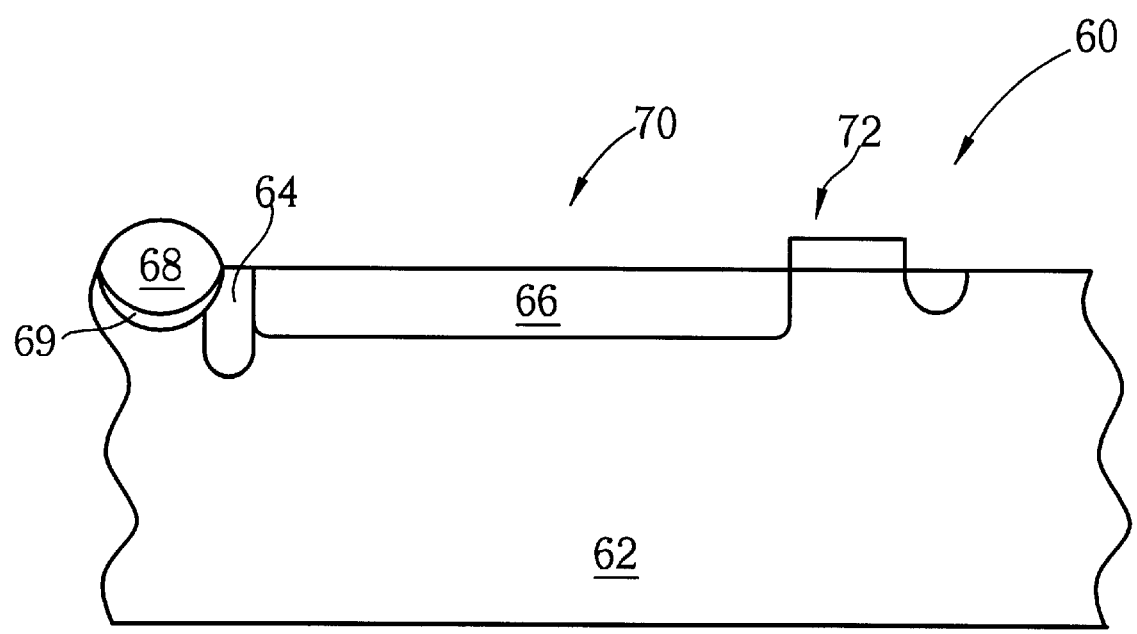
FIG. 9 is a cross-sectional view along line 9—9 of the photo diode shown in FIG. 8.

Please refer to FIG. 8 and FIG. 9. FIG. 8 is an overhead view of an alternative photo diode 60 of the present invention. FIG. 9 is a cross-sectional view of the photo diode 60 along the line 9—9 as shown in FIG. 8. The photo diode 60 comprises a MOS transistor 72, a photo sensor 70, a field oxide layer 68 and a channel stop 69. The photo sensor 70 comprises an n-type doped region 64 and another n-type doped region 66. The MOS transistor 72 is used as the reset MOS transistor of the photo diode 60 to zero the photo sensor 70 and to transmit the light-induced current. As shown in FIG. 9, the doped region 66 is shared with the source of the MOS transistor 72 to reduce the area of photo diode 60.

In the present invention photo sensor 40, 70 in the photo diode 30, 60, the doping density in the n-type doped region 44, 64 is less than $10^{13}$ cm$^{-3}$, and the n-type doped region 44 surrounds the n-type doped region 42 and the field oxide layer 38. The doped region 44, 64 reduces the electrical field around the doped region 42, 66, thereby reducing the noise associated with the field, especially in the region under the field oxide layer 38, 68. In addition, the phosphorus dopants in the n-type region 44 interact with the p-type substrate 32, 62 to form a wider depletion region 46 so as to expand the real active region and enhance the sensitivity to red light and green light. Furthermore, the n-type doped region has a shallower implantation depth, thereby forming a shallower depletion region 46 to promote sensitivity to blue light. As a result, the present invention enhances the magnitude of the light-induced current, and increases the signal-to-noise ratio of the photo diode.

In contrast to the prior art photo sensor, the photo sensor 40 according to the present invention has a lower ion dosage density in the second n-type doped region. The second n-type doped region surrounds the photo sensor to reduce the electrical field of the PN junction, reducing the leakage current. In addition, the depletion region is formed at a shallower depth, so the sensitivity of the depletion region to blue light is improved.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A photo sensor in a photo diode positioned on a semiconductor wafer, the surface of the semiconductor wafer comprising a silicon substrate containing first-type dopants, and a well of first-type dopants positioned in a predetermined region on the substrate, the photo diode comprising a MOS transistor of second-type dopants positioned on the surface of the well, a photo sensor positioned beside the well and electrically connected to the MOS transistor, and an insulation layer positioned on the surface of the substrate surrounding the photo sensor, the photo sensor comprising:
    a first doped region of second-type dopants positioned on the surface of the photo sensor; and
    a second doped region of second-type dopants positioned under the first doped region, the periphery of the second doped region in contact with the insulation layer, and a portion of the second doped region at least partially under the insulation layer;
    wherein the dopant density of the second doped region is less than that of the first doped region, and the second doped region functions to reduce the electrical field around the first doped region so as to reduce leakage current.

2. The photo sensor of claim 1 wherein the first-type dopants are either n-type or p-type, and the second-type dopants are either n-type or p-type but different from the first-type.

3. The photo sensor of claim 2 wherein the n-type dopants in the first doped region are arsenic (As) atoms, and the n-type dopants in the second doped region are phosphorus (P) atoms.

4. The photo sensor of claim 2 wherein the p-type dopants in the first doped region are $BF_2^+$ ions, and the p-type dopants in the second doped region are boron atoms.

5. The photo sensor of claim 2 wherein the MOS transistor is the reset MOS transistor of the photo diode and is used to zero the photo sensor.

6. The photo sensor of claim 2 wherein the dopants in the second doped region interact with the substrate to form a depletion region so as to enhance the sensitivity of the photo diode.

* * * * *